United States Patent
Memering et al.

(10) Patent No.: US 9,745,662 B2
(45) Date of Patent: Aug. 29, 2017

(54) LAYERED COATINGS FOR SAPPHIRE SUBSTRATE

(71) Applicant: APPLE INC., Cupertino, CA (US)

(72) Inventors: Dale N. Memering, San Francisco, CA (US); Christopher D. Prest, San Francisco, CA (US); Matthew Rogers, San Jose, CA (US)

(73) Assignee: APPLE INC., Cupertino, CA (US)

( * ) Notice: Subject to any disclaimer, the term of this patent is extended or adjusted under 35 U.S.C. 154(b) by 531 days.

(21) Appl. No.: 14/214,163

(22) Filed: Mar. 14, 2014

(65) Prior Publication Data

US 2014/0272298 A1    Sep. 18, 2014

Related U.S. Application Data

(60) Provisional application No. 61/798,892, filed on Mar. 15, 2013.

(51) Int. Cl.
| | |
|---|---|
| C23C 28/04 | (2006.01) |
| C30B 29/20 | (2006.01) |
| C23C 14/06 | (2006.01) |
| C23C 14/08 | (2006.01) |
| G02B 1/10 | (2015.01) |

(52) U.S. Cl.
CPC ........ C23C 28/044 (2013.01); C23C 14/0676 (2013.01); C23C 14/083 (2013.01); C23C 28/04 (2013.01); G02B 1/105 (2013.01); C30B 29/20 (2013.01); *Y10T 29/49888* (2015.01); *Y10T 428/24364* (2015.01)

(58) Field of Classification Search
None
See application file for complete search history.

(56) References Cited

U.S. PATENT DOCUMENTS

| | | | |
|---|---|---|---|
| 3,713,877 A * | 1/1973 | Kirchner et al. | ....... C04B 35/01 |
| | | | 427/398.1 |
| 3,736,171 A * | 5/1973 | Kirchner | ............... C03C 21/002 |
| | | | 428/432 |
| 3,809,574 A | 5/1974 | Duffy et al. | |
| 3,859,714 A | 1/1975 | DeLuca | |

(Continued)

FOREIGN PATENT DOCUMENTS

| | | |
|---|---|---|
| CN | 102400213 | 4/2012 |
| DE | 69612997 T2 | 9/2001 |

(Continued)

OTHER PUBLICATIONS

J.W. Morris, Jr., A Survey off Materials Science I. Structure, 2007.*

(Continued)

*Primary Examiner* — David Sample
(74) *Attorney, Agent, or Firm* — Brownstein Hyatt Farber Schreck, LLP

(57) ABSTRACT

A layered coating for a sapphire component is described herein. The sapphire component comprises one or more layers of alumina adhered to the surface of a sapphire member. At least the first layer of alumina adheres to the surface of the sapphire member filling all defects in the surface forming a pristine new layer that also provides isolation from damage.

19 Claims, 7 Drawing Sheets

(56) References Cited

U.S. PATENT DOCUMENTS

| | | | |
|---|---|---|---|
| 4,339,300 A * | 7/1982 | Noble | C30B 23/02 117/9 |
| 5,508,092 A | 4/1996 | Kimock | |
| 5,942,343 A | 8/1999 | Chen | |
| 6,440,242 B1 | 8/2002 | Fukazawa | |
| 6,528,123 B1 | 3/2003 | Cadden et al. | |
| 6,627,319 B2 | 9/2003 | Jacquiod et al. | |
| 6,916,542 B2 | 7/2005 | Buhay et al. | |
| 6,962,759 B2 | 11/2005 | Buhay et al. | |
| 7,125,926 B2 | 10/2006 | Satoh et al. | |
| 7,311,961 B2 | 12/2007 | Finley et al. | |
| 7,584,689 B2 | 9/2009 | Jones et al. | |
| 7,664,469 B2 | 2/2010 | Hutchison | |
| 7,738,187 B2 | 6/2010 | Pazidis et al. | |
| 7,793,580 B2 | 9/2010 | Jones et al. | |
| 7,966,785 B2 | 6/2011 | Zadesky et al. | |
| 7,998,586 B2 | 8/2011 | Lu et al. | |
| 8,015,970 B2 | 9/2011 | Klun et al. | |
| 8,021,758 B2 | 9/2011 | Sambasivan et al. | |
| 8,025,004 B2 | 9/2011 | Jones et al. | |
| 8,031,174 B2 | 10/2011 | Hamblin et al. | |
| 8,055,003 B2 | 11/2011 | Mittleman et al. | |
| 8,133,599 B2 | 3/2012 | Lu et al. | |
| 8,450,607 B2 | 5/2013 | Du et al. | |
| 8,685,490 B2 | 4/2014 | Lu et al. | |
| 8,728,634 B2 | 5/2014 | Medwick et al. | |
| 8,790,796 B2 | 7/2014 | Buhay et al. | |
| 2003/0228476 A1 | 12/2003 | Buhay et al. | |
| 2004/0102229 A1 | 5/2004 | Hutchison | |
| 2006/0051554 A1 * | 3/2006 | Kumakura | C30B 25/18 428/98 |
| 2007/0048526 A1 | 3/2007 | Hoffman et al. | |
| 2007/0224357 A1 | 9/2007 | Buhay et al. | |
| 2008/0139885 A1 | 6/2008 | Knapp | |
| 2009/0090241 A1 | 4/2009 | Julbe et al. | |
| 2009/0263651 A1 | 10/2009 | Cook | |
| 2010/0027383 A1 | 2/2010 | Suzuki et al. | |
| 2010/0124642 A1 | 5/2010 | Lu et al. | |
| 2010/0330814 A1 * | 12/2010 | Yokota | H01L 21/3105 438/771 |
| 2011/0155409 A1 | 6/2011 | Du et al. | |
| 2011/0169396 A1 * | 7/2011 | Drazenovic | C04B 35/117 313/141 |
| 2012/0172209 A1 | 7/2012 | Lu et al. | |
| 2013/0082358 A1 * | 4/2013 | Aida | C30B 29/20 257/618 |
| 2013/0344321 A1 | 12/2013 | McSporran et al. | |
| 2014/0087160 A1 | 3/2014 | McSporran et al. | |
| 2014/0087179 A1 * | 3/2014 | Takano | C04B 41/009 428/336 |
| 2014/0116329 A1 | 5/2014 | Chaudhari | |
| 2014/0160649 A1 * | 6/2014 | Joyce | G06F 1/1637 361/679.01 |
| 2014/0193606 A1 * | 7/2014 | Kwong | C30B 29/20 428/138 |
| 2014/0355126 A1 * | 12/2014 | Gutierrez | G02B 1/11 359/609 |
| 2015/0044447 A1 * | 2/2015 | Henley | C30B 33/04 428/220 |

FOREIGN PATENT DOCUMENTS

| | | |
|---|---|---|
| DE | 112004001032 | 5/2006 |
| JP | 09008690 | 1/1997 |
| JP | 2008111984 | 5/2008 |
| WO | WO02/054718 | 7/2002 |
| WO | WO2009/025842 | 2/2009 |
| WO | WO2012/088209 | 6/2012 |
| WO | WO2013/134159 | 9/2013 |

OTHER PUBLICATIONS

U.S. Appl. No. 61/704,275, "Oleophobic Coating on Sapphire," Weber et al., filed Sep. 21, 2012.*
Barbour JD et al., "The mechanical properties of alumina films formed by plasma deposition and by ion irradiation of sapphire," Nuclear Instruments & Methods in Physics Research, Section—B:Beam Interactions with Materials and Atoms, Elsevier, Amsterdam, NL, vol. 166-167, May 1, 2000, pp. 140-147.
Chaudhari, P. et al., Heteroepitaxial Silicon Film Growth at 600C From an Al—Si Eutectic Melt, pp. 5368-5371, Mar. 19, 2010, Thin Solid Films 518, Elsevier, US.
Feng et al., "Strengthening sapphire at elevated temperatures b Si02 films," Applied Surface Science, Elsevier, Amsterdam, NL, vol. 253, No. 12, Mar. 13, 2007, pp. 5365-5367.
Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.
Klein, Claude et al., "Flexural strength of sapphire: Weibull statistical analysis of stressed area, surface coating, and polishing procedure effects," Journal of Applied Physics, American Institute of Physics, vol. 96, No. 6, Jan. 1, 2004, 8 pages.
Kobrin, P.H. et al., "Compressive thin films for increased fracture toughness," Proceedings of SPIE, vol. 683, Jan. 1, 1986-Aug. 19, 1986, 5 pages.
Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.
Patscheider, Jorg et al., "Plasma-Induced Deposition of Thin Films of Aluminum Oxide," Plasma Chemistry and Plasma Processing, Plenum Press, New York, US, vol. 12, No. 2, Jun. 1, 1992, 17 pages.
Seman, Michael T. et al., "An Analysis of the Deposition Mechanisms involved during Self-Limiting Growth of Aluminum Oxide by Pulsed PEVCD," Chemical Vapor Deposition, Wiley-VCH Verlag, Weinheim, Germany, vol. 14, No. 9/10, Sep. 1, 2008, 7 pages.
Simpson, Todd W. et al., "Kinetics of the Amorphous → γ → α Transformations in Aluminum Oxide: Effect of Crystallographic Orientation," Journal of the American Ceramic Society, vol. 81, No. 1, Jan. 1, 1998, 6 pages.
International Search Report and Written Opinion, PCT Application No. PCT/EP2014/054819, 12 pages, Apr. 30, 2014.
International Search Report and Written Opinion, PCT Application No. PCT/EP2014/054820, 11 pages, Apr. 30, 2014.
International Search Report and Written Opinion, PCT Application No. PCT/US2013/060989, 10 pages, Feb. 5, 2014.
International Search Report and Written Opinion, PCT Application No. PCT/US2013/066193, 11 pages, Jan. 20, 2014.
International Search Report and Written Opinion, PCT Application No. PCT/US2014/029026, 15 pages, Jul. 30, 2014.
U.S. Appl. No. 13/679,493, filed Nov. 16, 2012, Kelvin Kwong.
U.S. Appl. No. 14/033,890, filed Sep. 23, 2013, Douglas Weber et al.
U.S. Appl. No. 14/453,065, filed Aug. 6, 2014, Rudolf Beckman et al.
U.S. Appl. No. 14/453,102, filed Aug. 6, 2014, Rudolf Beckmann et al.

* cited by examiner

LAYERED COATINGS FOR SAPPHIRE SUBSTRATE

CROSS REFERENCE TO RELATED APPLICATION

This Application claims priority to U.S. Provisional Application No. 61/798,892, filed on Mar. 15, 2013, which is incorporated by reference herein in its entirety.

TECHNICAL FIELD

The subject matter of this application relates generally to surface coatings on substrates. In particular, the application relates to coatings which strengthen the underlying substrate for use as a window on an electronic device, such as mobile phones and computing devices.

BACKGROUND

Corundum is a crystalline form of aluminum oxide and is found in various different colors, most of which are generally referred to as sapphire. Sapphire is a hard and strong material with a hardness of 9.0 on the Mohs scale, and, as such, is capable of scratching nearly all other minerals. Due to its brittle nature, it is susceptible to dramatic strength reductions as a result of small defects caused by interactions with its environment. Therefore, while a sapphire part may be very reliable leaving the factory, after time and use it may become less reliable due to an accumulation of minor damage.

Additionally, producing defect free parts can be very challenging. Brittle materials' strength are limited by the flaw population on the surface. An inconsistent or inadequate surface finishing can lead to very weak parts. Glass is chemically strengthened to a significant depth to minimize the effect of these flaws, but on extremely hard materials such as sapphire, a similar process is not readily available. For example, the sapphire's hardness makes cutting and polishing the material both difficult and time consuming when conventional processing techniques are implemented. Further, conventional processing tools such as cutters experience relatively rapid wear when used on sapphire. This further increases the resource demand when surface finishing sapphire parts.

Additionally, the use of parts formed from different materials, such as sapphire and glass, glass and plastic, sapphire and plastic, and so on, in devices can lead to differences in the optical appearance of side by side components due to the high reflectance of sapphire. Between two materials having particularly strong differences in reflectance the effect can be very noticeable.

SUMMARY

Systems for strengthening a sapphire substrate are described herein. Various embodiments described herein encompass a sapphire substrate having a first surface and a second surface with a plurality of surface defects. One or more alumina layers may be deposited on the first surface. Additionally, the second surface of the substrate may adhere to a second layer formed from alumina. An additional layer may be adhered to the first layer. The additional layer and the first layer may comprise different physical properties. A plurality of layers may be adhered to the first surface of the sapphire substrate and/or a plurality of layers may be adhered to the second surface of the sapphire substrate. The material (e.g. alumina) in the first layer may have a first hardness as measured in Mohs. Likewise, the material (e.g. alumina) in the additional layer may have a second hardness as measured in Mohs. The first hardness and the second hardness may be different. For example, the second layer may be harder than the first layer.

In accordance with various embodiments, the additional layer comprises a variety of materials. For example, the additional layer may be a polymer matrix having hard blocks suspended within the polymer matrix. The hard blocks may be configured to deflect into the depth and/or laterally within the polymer matrix. The polymer matrix and the hard blocks may have refractive indexes that match. In another example, the additional layer may be an anti-reflective coating having a refractive index less than the first layer.

In accordance with various embodiments, the sapphire substrate surfaces may be preconditioned. For example, at least the first surface or second surface may be an amorphous surface caused by ion implantation converting an original crystalline surface on the sapphire substrate into the amorphous surface.

Methods for strengthening a sapphire substrate are described herein. In accordance with various embodiments, a method comprises obtaining a sapphire substrate having an upper surface and a lower surface. At least one of the upper surface and lower surface of the sapphire substrate may be preconditioned. A first material may be deposited on the sapphire substrate forming a first layer. The first layer may have at least one different material characteristic than the sapphire substrate.

A second material may be deposited on the first layer forming a second layer. The second layer may have at least one different material characteristic than the first layer and/or the sapphire substrate. The first material and second material may be alumina, in certain embodiments. In certain embodiments, the second material may have a structural form that has a lower index of refraction than the structural form of the first material.

In some embodiments, the first material may be deposited by a first process. The second material may be deposited by the first process but with a different set of process conditions. The second material may be deposited by a second process that may deposit the second material in a structural form that is harder than the structural form of the first material.

The first material, the second material, and the sapphire substrate may be heated prior to deposition of the first material and the second material. The first material, the second material, and the sapphire substrate may be cooled after deposition, allowing the differences in thermal expansion of the sapphire substrate to compress the first material and second materials.

DETAILED DESCRIPTION

Numerous consumer and non-consumer devices utilize coverings, widows, and/or surfaces formed from hard materials like sapphire. As discussed herein, in accordance with various embodiments, one or more layers of one or more beneficial coating may be applied to the coverings, widows, and/or surfaces. The one or more layers may be specifically selected to provide strength, protection, or other improved performances as discussed herein. For example, a layer of an alumina coating may be deposited on a sapphire substrate providing increased strength and/or protection to the sapphire substrate.

Figure 1A:
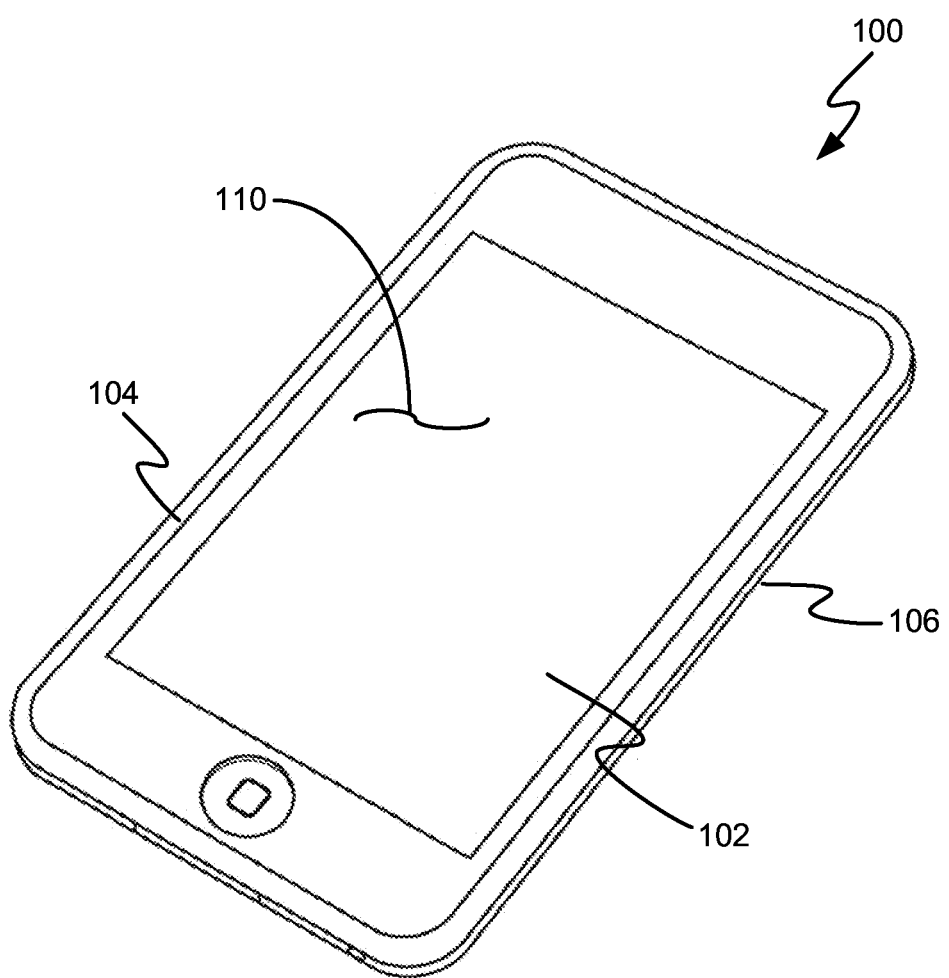
FIG. 1a illustrates a device utilizing a hardened substrate as a window in accordance with an embodiment.

In accordance with various embodiments, FIG. 1a illustrates a device which may utilize hard substrate as a window. A "hard" substrate is one that is generally scratch resistant, or more particularly one that has been treated to be more scratch resistant than the same material in an untreated form. For example, sapphire and alumina may be the same chemical composition of Al2O3. However, based on structural differences, alumina may have a slightly reduced hardness compared to sapphire's Mohs hardness of 9.

Sapphire may be considered a hard material, as may various forms of alumina. Accordingly, it should be appreciated that the terms "soft" and "hard" may also be used in a relative way. For example, alumina may be softer than sapphire. Similarly, one form of alumina may be harder than another form of alumina.

Device 100 may be any of a variety of devices utilizing a hard substrate as a covering, widow, and/or surface. In various examples, device 100 may include electronic devices such as a mobile phone, tablet computer, notebook computer, instrument window, appliance screen and the like. Additionally, device 100 may include non-electronic devices such as mechanical watches which utilize a similar hard window.

Figure 1B:
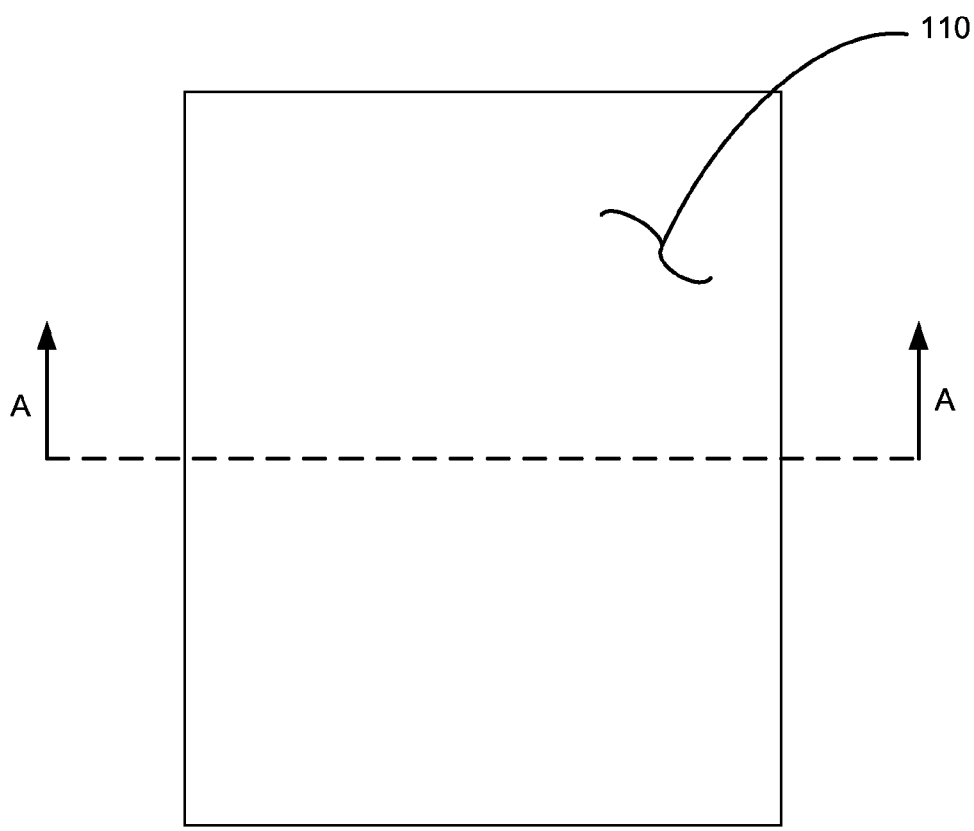
FIG. 1b illustrates a window portion of the device window of FIG. 1a in accordance with an embodiment.

Device 100 may include cover 102 with a bezel 104 about all or a part of its outer periphery (e.g. edge) where bezel 104 is couplable to housing 106 in a manner that secures cover 102 to device 100. Depending on the application, bezel 104 and housing 106 may be formed of a variety of different materials including, but not limited to, polymer materials (e.g. plastics), metals (e.g. aluminum, steel, etc.), amorphous glass materials, composite materials, and combinations thereof. Cover 102 may include a variety of components for viewing the display of the device 100. Particularly, cover 102 may have window 110. Window 110 as illustrated in FIG. 1b may be a sapphire substrate provided to protect the components of cover 102 from damage. Various examples and embodiments of this window 110 may be discussed herein.

In accordance with various embodiments, window 110 may be manufactured from any of a variety of different materials. The materials may include transparent polymer, amorphous glass, and/or transparent crystalline materials. Window 110 generally may be formed from any of a number of extremely hard translucent materials. For example, extremely hard translucent materials may include sapphire. While sapphire's inherent strength is higher than that of amorphous glass, there is no well-established process to provide significant strength improvements after mechanical shaping, like chemical strengthening imparts to amorphous glass. Failures in sapphire are typically driven by propagations of surface defects under stress.

Consistent heavy use of a device 100 having a sapphire protective substrate may cause defects in the surface. Even in the absence of environmental damage to the substrate, the substrate is unlikely to be manufactured flawlessly so surface defects are likely to be present. The defects may dramatically reduce the strength of the parts, so a thicker substrate and/or more surface finishing processes may be used to improve the quality of the substrate, although these may substantially increase manufacturing costs. Cost savings could be achieved by reducing the manufacturing steps necessary to provide an ideal finish on the surfaces of the substrate. Also, a reduction in substrate thickness may produce significant cost savings.

In accordance with various embodiments, a coating may be applied to the surface to reduce the effects of the surface defects. The application of the coating may fill the surface defects. The application of the coating may form a beneficial layer on the surface of the sapphire substrate that may also provide a uniform outer surface that is substantially without defects. Providing the uniform surface may allow the substrate to endure higher stresses during use. While a first coating may address surface defects, a plurality of coatings may provide additional benefits.

As used herein the composite of one or more coatings applied to the substrate is referred to as a "stack". The application of one or more coatings may also provide additional characteristics to the stack. The application of additional coatings adjacent to, below, and/or on top of the first coating may also provide additional benefits. Various properties for the substrate may be achieved by applying one or more coatings to one or more of the substrate surfaces. In many embodiments, this may be accomplished without sacrificing performance of the original substrate.

As discussed above, a sapphire substrate 200 may have defects 202 and 204 on the surface. While it may be counter-intuitive to apply a coating of a softer but similar material (e.g. alumina) to the sapphire, such a coating may strengthen the sapphire substrate. For example, as the sapphire substrate 200 is stressed in tension the defects are pulled apart which may cause failure. However, a coating may limit the amount the defects 202 and 204 are pulled apart under tension and may be beneficial as it may ultimately limit additional cracking of substrate 200. In accordance with various embodiments, the coating may form a layer suitable to control distortions of the surface that could otherwise cause the defects (e.g. defects 202/204) to expand and cause failure of the sapphire substrate. By sealing the substrate surface defects the weakest points on the surface are reduced and/or eliminated. Sealing the defects helps prevent force from directly impacting the defects and causing additional damage. Creating a uniform layer puts a barrier between destructive external force and the stress risers in the defects. The barrier may have the effect of spreading out the force of an impact and limit the localized stress at the defect. Various embodiments may employ silicon oxynitride (SiON) as a coating, while others may use alumina, and still others may use a combination of the two.

In accordance with various embodiments, the coating may be applied as a sacrificial coating. That is, the layer formed by the coating may be a sacrificial surface. Particularly, a softer surface (e.g. a surface of a material that is lower on the Mohs scale) may not suffer the damage that a hard surface (e.g. a surface of a material that is higher on the Mohs scale like sapphire) may suffer (e.g. damage penetrates to a shallower depth). A less brittle surface may not suffer the damage that a more brittle surface may suffer (e.g. damage penetrates to a shallower depth). Less damage in the coating layer results in fewer defects capable of expanding into failure of the bulk substrate. In response to potentially damaging contact with the surface, the protective layer may absorb the damage and therefore allowing the substrate to maintain its high strength. In accordance with various embodiments, SiON and/or alumina may be a useful material for forming a protective layer.

Additionally, SiON and/or alumina applied to the sapphire substrate surface may have internal compressive stresses strengthening the alumina layer and applying a compressive force to the sapphire surface limiting distortion and failure of the defects. The internal compressive stresses may be applied to the alumina layer through the adhesion and/or deposition process. During the coating process the sapphire substrate surface may be bombarded with ions to adhere the SiON or alumina to the substrate 200. Changing the coating parameters, such as the ratio of bombarding ions to SiON or alumina, may provide a layer with an internally high compressive stress. Also, internal compressive stresses may be applied through the difference in coefficients of thermal expansion between the SiON or alumina layer and the sapphire substrate. For example, the SiON or alumina and the sapphire substrate may be heated prior to deposition of the SiON/alumina. After depositing the material, the sapphire substrate and the alumina or SiON may cool together. The differences in thermal expansion of the sapphire substrate compared to the coating material may cause the coating material to compress the surface of the sapphire, resulting in a sapphire surface layer with significant compressive stresses. Depending on the composition of the coating material layer, and the process conditions, the opposite effect could be achieved to yield a highly stressed SiON and/or alumina coating.

Additionally, applying a sufficiently high heat to the coating material may cause recrystallization of the coating material, whether SiON, alumina, or a combination thereof. Generally, these coating materials may be applied to a sapphire substrate as a film; the film is typically amorphous when deposited on the substrate. Heating the film may anneal the film, thereby causing formation of polycrystals from the amorphous film. By recrystallizing the coating material in this manner, the overall strength of the coating and resistance to scratches, cracking, and impact-related failures may be increased.

In accordance with various embodiments, each of the one or more layers may be different from one another (or at least adjacent layers), thereby offering a characteristic not provided by the layer or substrate immediately adjacent. The differences may extend to, for example, material, chemical structure, thickness, deposition process, etc. Each different coating may offer slightly different physical characteristics. For example, coatings may have different strength, hardness, oleophobic properties, optic properties (including anti-reflectiveness, color transmittance, etc.), and so on.

Figure 2:
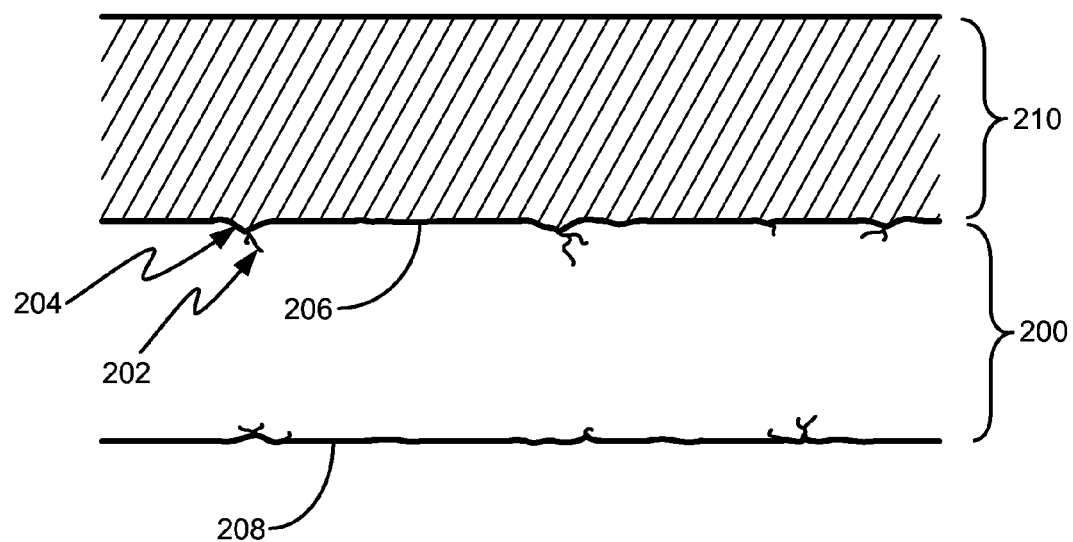
FIG. 2 illustrates a cross-sectional schematic view of a substrate having a first layer taken along section line A-A of FIG. 1b in accordance with an embodiment.

As previously indicated and with respect to FIG. 2, one or more layers may be applied to one or more surfaces of substrate 200. Any number of these one or more layers may be applied to substrate 200. In accordance with various embodiments, as FIG. 2 illustrates in the cross-sectional schematic view of a substrate, a single first layer 210 may adhere to the upper surface 206 of substrate 200 directly.

Figure 3:
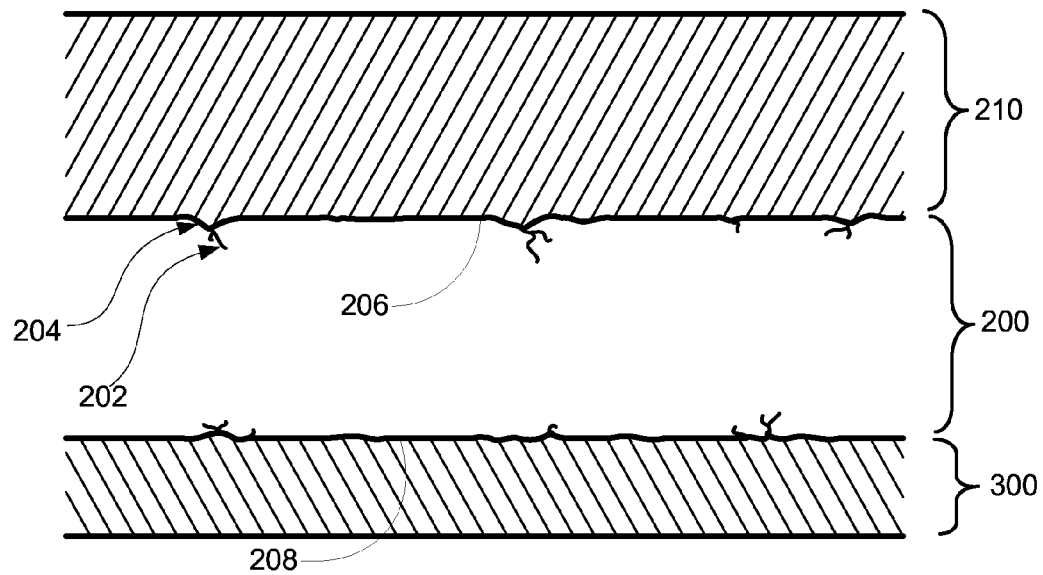
FIG. 3 illustrates a cross-sectional schematic view of a substrate between a first layer and a second layer taken along section line A-A of FIG. 1b in accordance with an embodiment.

In accordance with various embodiments, as FIG. 3 illustrates, a single second layer 300 may adhere to the lower surface 208 of substrate 200 directly. "Directly" adhering layers to one another may be accomplished through the aforementioned ion bombardment, for example. Generally, direct adhesion of layers in this fashion does not require or utilize any separate chemical adhesive between the layers.

While FIG. 3 illustrates both the second layer 300 and the first layer 210 being adhered to substrate 200, it may be noted that each layer may be utilized separately. For example, first layer 210 may be adhered to substrate 200 without second layer 300 (as illustrated in FIG. 2). In various examples, second layer 300 may be adhered to substrate 200 without first layer 210. The second layer 300 may be the same or similar material as discussed with regards to first layer 210. Additionally, second layer 300 may be structured the same or similar and/or perform similar functions as those discussed with regard to first layer 210 and/or any other layer discussed herein.

Figure 4:
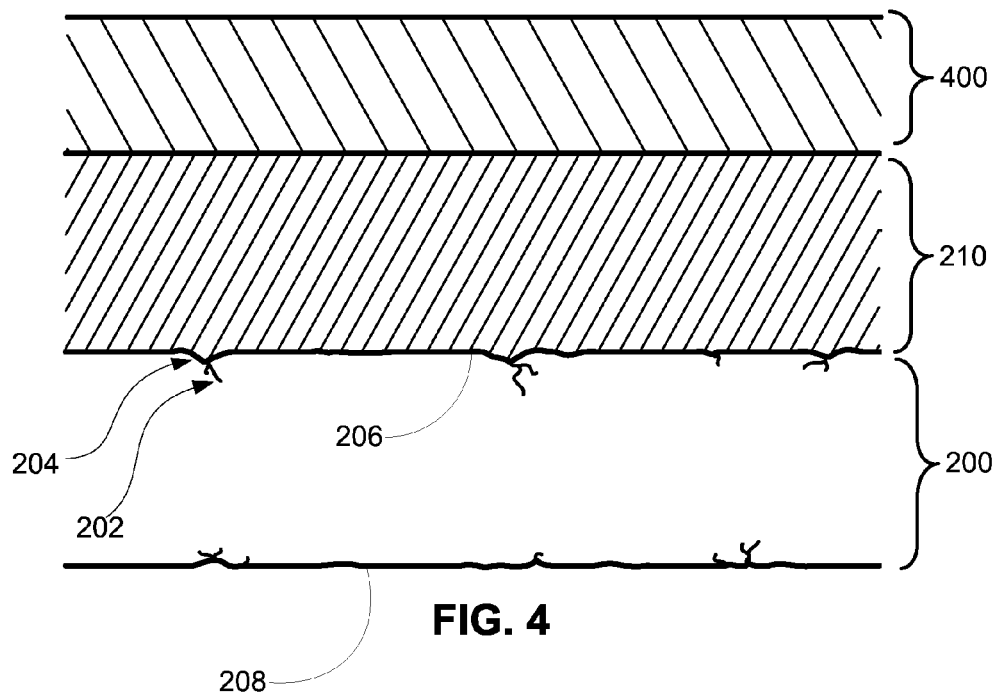
FIG. 4 illustrates a cross-sectional schematic view of a substrate with a first layer and an additional layer taken along section line A-A of FIG. 1b in accordance with an embodiment.
Figure 5:
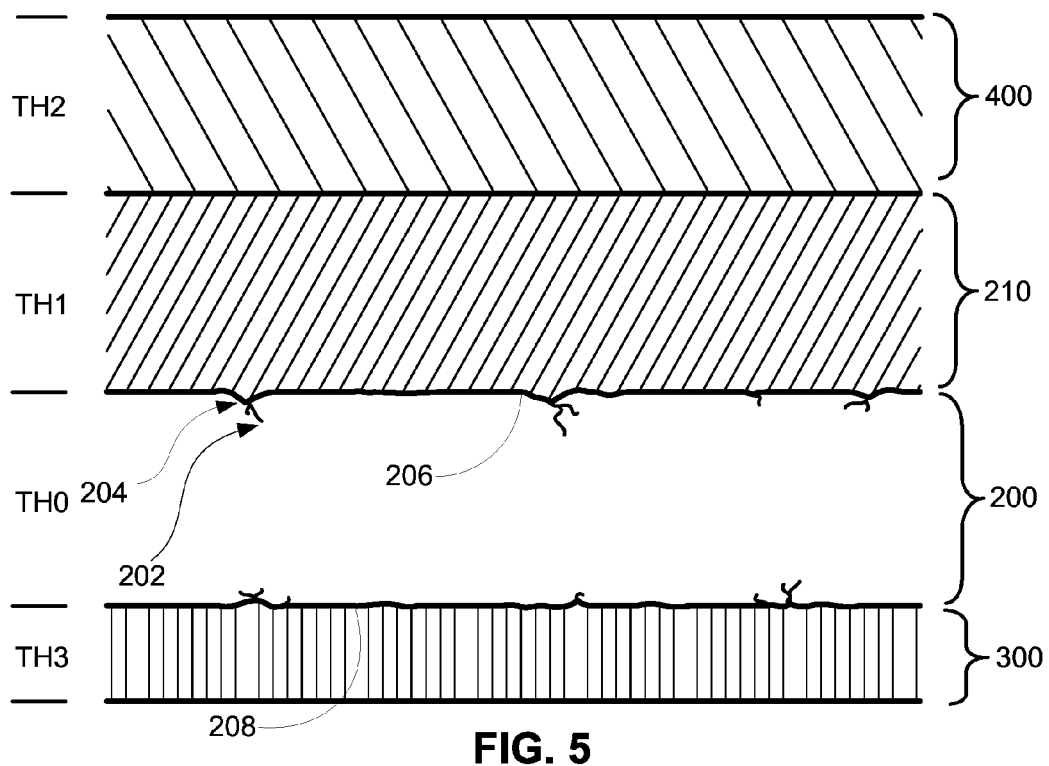
FIG. 5 illustrates a cross-sectional schematic view of a substrate with a first layer and an additional layer and the substrate resides between the first layer and a second layer taken along section line A-A of FIG. 1b in accordance with an embodiment.

In accordance with various embodiments, as FIG. 4 illustrates in the cross-sectional schematic view of a substrate, two or more layers may be adhered to the upper surface 206 of substrate 200. For example, first layer 210 may be directly adhered to the upper surface 206 of substrate 200 with an additional layer 400 adhered to first layer 210. In accordance with various embodiments, as FIG. 5 illustrates a cross-sectional schematic view of a substrate, a plurality of layers (e.g. first layer 210 and additional layer 400) may be adhered to the upper surface 206 of substrate 200. One or more layers 300 may be adhered to the lower surface 208 of substrate 200. The various layers discussed herein may be adhered to substrate 200 in any combination, orientation, thickness, or number, regardless of whether or not the specific combination, orientation, thickness, or number is discussed herein. For example, when referring to upper lay 210 and its physical size, material, chemical structure, thickness, deposition process, and the like, the same characteristics may apply only to first layer 210 or the same characteristics may apply to additional layer 400, layer 300, or other layers not specifically discussed in addition to layer 210 and/or instead of layer 210 in any combination, orientation, and/or number discussed herein or not.

Each of the layers discussed herein may be formed from a variety of different materials and/or processes. For example, first layer 210 may be formed from a variety of different materials. In an embodiment, first layer 210 may be an amorphous alumina coating or a SiON coating. For ease of reference and readability, references herein to an alumina coating, film, layer or the like are intended to encompass SiON films, coatings, layers, and so on, as well as combinations of alumina and SiON. The alumina coating may be useful as the layer immediately adjacent to the sapphire substrate 200 due to the material similarity between amorphous alumina and sapphire, both are Al2O3. Various different forms of alumina with various different physical properties may be deposited forming the layer. As such, the different physical properties may be achieved by depositing different structural or compositional forms of the alumina (such as may be formed by doping) to achieve, for example, a different hardness between the different structural and/or compositional forms or for example, different optical properties between the different structural and/or compositional forms. The variation in alumina characteristics may enable different forms of alumina to be deposited on different layers. For example, first layer 210 may be a first alumina structure and additional layer 400 may be a second alumina structure. In various embodiments, the first alumina structure on the first layer 210 may be softer than the second alumina structure on the additional layer 400. In various embodiments, the first alumina structure on the first layer 210 may be harder than the second alumina structure on the additional layer 400.

In accordance with various embodiments, the one or more layers applied to substrate 200 may be applied in a variety of thicknesses. As illustrated in FIG. 5, first layer 210 may have a thickness of TH1, additional layer 400 may have thickness of TH2, lower layer 300 may have a thickness of TH3, and substrate 200 may have a thickness of TH0. In various examples, the upper layer 210 thickness of TH1 may be less than the substrate 200 thickness TH0. Further, TH1 may be applied as a layer that may be 2-4 μm, less than 2 μm or greater than 4 μm. In various examples, TH1, TH2, and TH3 may have different thicknesses. Additionally, TH1, TH2, and TH3 may be the same thicknesses. In still embodiments, TH1 may be the thickest layer, TH2 may be the thickest layer, or TH3 may be the thickest layer. The foregoing examples of differing thicknesses are not intended to be limiting, but illustrative. One of ordinary skill in the art will understand that based on the description the various thicknesses may apply to a single layer or a plurality of layers and thus embodiments are not limited to any specific orientation of the thicknesses relative to the example layers discussed herein.

The application of thicknesses may be varied to achieve a specific characteristic. In accordance with various embodiments, as illustrated in FIG. 5, thickness TH3 of lower layer 300 (which may be applied to the bottom side of the substrate 200) may be thinner than thickness TH1 of the first layer 210. In another example, the opposite could be true with thickness TH1 of the upper surface 206 being thinner than thickness TH3 of the lower surface 208. This asymmetric application of the various layers may be beneficial as the upper surface 206 of substrate 200 may be used differently (e.g. upper surface 206 may be in substantial interaction with the environment) than the lower surface 208 of substrate 200 (e.g. lower surface 208 may face the interior of the device 100). Accordingly, the lower surface 208 may receive less impact, and thus be subject to less damage, in response to normal use of the device. As such, a thinner coating may be as beneficial as a thicker coating when applied to the lower surface 208. Nonetheless a coating may be beneficial on the lower surface 208 since, as stated above, the substrate is unlikely to be manufactured flawlessly and so surface defects are likely to be present. Additionally, cost-savings could be achieved by reducing the manufacturing steps necessary to provide an ideal finish on the lower surface 208 in exchange for applying a strengthening layer such as second layer 300.

It may be noted that asymmetric application of layers above and below the sapphire substrate 200, as illustrated in FIG. 5, may warp the sapphire substrate 200. In accordance with various embodiments, applying a high-compressive layer on the bottom surface of the sapphire substrate may make the bottom substrate surface stronger by placing the bottom substrate surface in compression. This may reduce the overall part warping that may otherwise occur due to differing coating thicknesses of the top surface and the bottom surface of the sapphire substrate.

Electronic devices such as mobile phones and laptops already have numerous layers underlying or adjacent to the sapphire substrate. For example, a touch sensitive display circuit may be layered below, within, or above the surface of the sapphire substrate. A touch sensitive screen (or other component) may be incorporated into device 100, for example, within or beneath cover 102. In accordance with various embodiments, lower layer 300 may be applied directly to the lower surface 208 of sapphire substrate 200 and then the touch sensitive component may be layered against lower layer 300. In accordance with various embodiments, lower layer 300 may be applied to the touch sensitive component which may be layered against bottom surface 208.

As discussed, first layer 210 may be applied in combination with one or more additional layers 400 on substrate 200 allowing the composite of the substrate 200 to benefit from the combined effects of the stack. For example, utilizing a soft alumina or SiON to form the first layer 210 provides an interface with the substrate 200, limiting significant distortion of the surface defects 202 and 204 ultimately preventing additional cracking of substrate 200, and providing a sacrificial layer preventing additional defects from forming on surface 206 of substrate 200.

In various embodiments, first layer 210 may be a soft form of alumina (e.g. the alumina may have a hardness on the Mohs scale of 7 or thereabouts, to less than 9) configured as a protective layer over the sapphire substrate 200. Similarly lower layer 300 may be a soft form of alumina configured as a protective layer over the sapphire substrate 200. However, as alumina may change the optical characteristics, strength characteristics, and/or hardness characteristics of the stack, the additional layer 400 may be selected to reduce any negative effects of the lower layer 210.

The additional layer 400 may be formed from any of a variety of materials or have any of a variety of characteristics. For example, the characteristics for additional layer 400 may include improved durability, improved clarity, and/or improved anti-reflective performance. The multiple-layers or coatings may be implemented to provide clear optics or even an anti-reflective performance while preserving a strengthening and durability enhancing effect. Additionally, the coating may be selected to improve reliability, with the thickness and structure being driven by the goal of providing resistance to impact events or hard material interactions. Significant levels of stress may be imparted into the coating to provide a bulk strength enhancement.

In accordance with various embodiments, the outer most layer, which as illustrated in FIGS. 4-5 is additional layer 400, may comprise a harder surface in comparison to first layer 210. As first layer 210 may be selected to be a soft form of alumina or SiON it may be beneficial to add an additional layer 400 configured to provide a hard outer layer that interfaces with the environment. In various embodiments, additional layer 400 may be an alumina or SiON specifically processed to be harder than first layer 210.

In addition to other benefits or on its own, a layer may be formed to provide improved performance of an electronic screen as visible through the sapphire substrate. For example, an anti-reflective (AR) coating may be applied to form an anti-reflective layer. It may be noted that in accordance with various embodiments, the AR coating may not be the typical durable AR coating which often comprises materials such as silicon-nitride ($Si_3N_4$) and silica-dioxide ($SiO_2$). Instead the AR coating may involve similar materials to the sapphire substrate such as alumina ($Al_2O_3$). However, in other embodiments, the AR coating may be formed from $SiO_2$, SiON, magnesium fluoride ($MgF_2$), silicon-nitride ($Si_3N_4$), Alumina ($Al_2O_3$), hafnium oxide ($HFO_2$), Hydrogenated carbon (DLC), and/or niobium oxide (NbXO).

In accordance with various embodiments, the outermost layer may comprise an anti-reflective (AR) coating. The refractive index difference between sapphire and air is high, which may causing unwanted reflections to appear on the sapphire surface in certain lighting conditions. The refractive index between alumina and air is also somewhat high and so similar issues may be experienced when the uppermost surface of an embodiment is formed from an alumina coating. To reduce any mismatch between the refractive index of air and the sapphire an additional coating may be added to the coating 210 to provide anti-reflective properties.

As an alternative, multilayer stacks of alumina and/or SiON may be used to minimize or reduce the mismatch between adjacent layers' indices of refraction. For example, multiple layers having different hardnesses (and thus different indices of refraction) may be deposited on a sapphire substrate, with each such layer or film after the first being deposited on the layer beneath it. The layers/films may be chosen such that the index of refraction between any two adjacent layers is within a relatively small delta, even though the difference between the index of refraction of the sapphire substrate and the outermost layer may be larger than the difference between any two adjacent layers. In this manner, optical artifacts may be reduced or eliminated.

The first layer 210 may also be adjusted to remove or adjust certain attributes of the stack of layers. For example, the optical properties through the stack may have a negative effect on the transmittance of light. Thus, the stack may appear colored, tinted, and/or hazy when viewed. To compensate, certain layers of the stack, such as the layer closest to the sapphire substrate 200, may be modified to remove the negative effect. As such and in accordance with various embodiments, lower layer 210 may comprise a material selected to compensate for a color shift (e.g. typical anti-reflecting materials coatings). The use of first layer 210 to control optical properties though the stack and the effect on the transmittance of light may affect first layer 210's efficacy as a strengthening layer. As such, additional layer 400 may be added; this additional layer 400 may be formed from a material suitable for use as a strengthening layer. The layer 400 may be, for example, alumina or SiON.

In accordance with various embodiments, any of the layers may additionally have a gradient of properties, structural features, and/or materials throughout that layer. For example, alumina and/or SiON may have a gradient of properties due to a continuous modification of the manner of depositing the alumina material. In various examples, a layer may transition from one material to another. Such a structure is discussed in U.S. Provisional Patent Application No. 61/704,275, filed Sep. 21, 2012 and entitled "Oleophobic Coating On Sapphire," (incorporated by reference). Specifically, the layers may have a gradient of materials, from alumina or SiON to silica, occurring within the layer. A layer of this sort may be used when incorporating an oleophobic material into an embodiment. For example, first layer 210 may be a gradient layer of alumina or SiON to silica and additional layer 400 may be an oleophobic material.

Figure 6A:
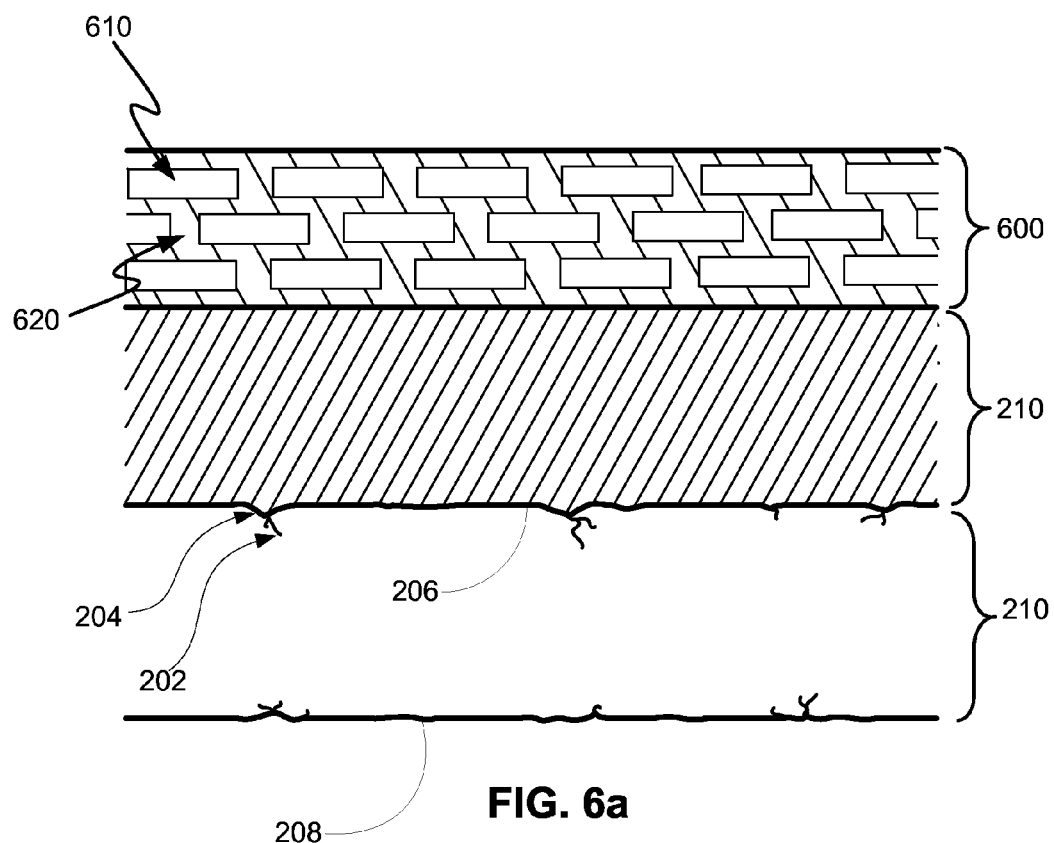
FIG. 6a illustrates a cross-sectional schematic view of a substrate with a first layer and an additional layer taken along section line A-A of FIG. 1b in accordance with an embodiment.

Similar to the layers discussed herein, composite materials utilized as layers. In accordance with various embodiments, as illustrated in FIG. 6a, an exterior layer 600 may take the form of a polymer matrix 620 having a plurality of hard blocks 610 suspended within the polymer matrix 620. In some embodiments, the plurality of hard blocks 610 may form a single row at the surface of the matrix. Alternatively or additionally, the plurality of hard blocks 610 may form multiple overlapping rows. The plurality of hard blocks 610 may be configured to deflect into the depth of, and laterally within, the polymer matrix 620. In order to prevent visually noticeable discontinuities between the blocks 610 nd matrix 620, the matrix and blocks may have matching, or near matching, refractive indexes.

The effect of this structure is that, when applied as a surface, exterior layer 600 may provide the strength, feel and/or hardness properties of the hard blocks 610, but have the flexibility of the polymer matrix 620. Providing a number of rows of the hard blocks 610 in the polymer matrix 620 may create a layer that possess sufficient rigidity (and other mechanical properties) to be utilized as a substrate in many applications, such as for use as a replacement for a cover glass in an electronic computing device. The blocks may be formed small portions of sapphire substrate, masses of alumina or SiON deposits, and the like.

Figure 6B:
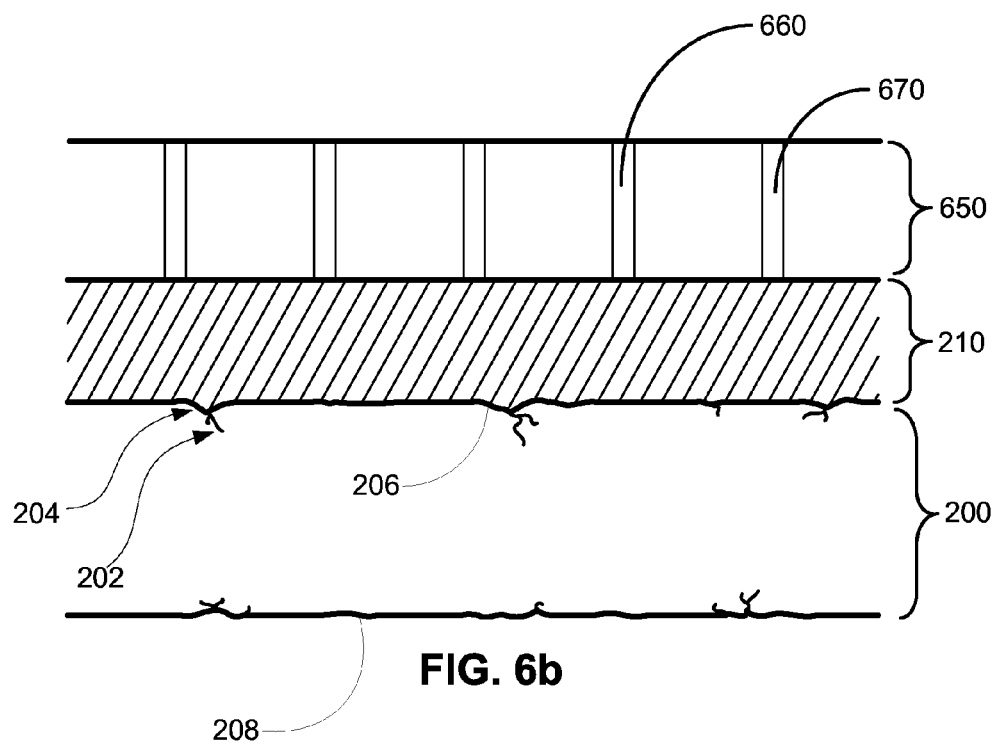
FIG. 6b illustrates a cross-sectional schematic view of a substrate with a first layer and an additional layer taken along section line A-A of FIG. 1b in accordance with an embodiment.

In addition to aligning blocks of sapphire, alumina, SiON and the like in a polymer matrix, a segmented substrate may be provided in a variety of other fashions. For example and as illustrated in FIG. 6b, an exterior layer 650 may be formed from a material deposited with sub-layers perpendicular to the substrate on which the layer is deposited. For example, layer 650 may include a plurality of vertical sub-layers 660 and 670. The inclusion of these vertical sub-layers may prevent defects, cracks, or failures from propagating horizontally.

The various layers discussed herein may be applied to the substrate 200 in a variety of manners. As discussed throughout, in various examples, the first layer 210, second layer 300, and additional layer 400 may be an alumina or SiON layer. This layer may be applied with suitable adhesion via a number of different technologies. For example, the technologies may include plasma enhanced chemical vapor deposition (PECVD), ion beam assisted deposition (IBAD), physical vapor deposition (PVD), and/or chemical vapor deposition (CVD), each producing a slightly different structure to the layer. The different structure may affect the hardness, strength, and/or optical properties of the final part. The deposition of the coating materials varies by process, with the specific conditions, including the atmosphere, the temperature of the substrate and chamber, the pressure, presence, ratio, type and energy of additional energetic ions, the deposition rate and the condition of the applied coating material, all contributing to the final structure, composition and density that can affect the various material properties.

Figure 7:
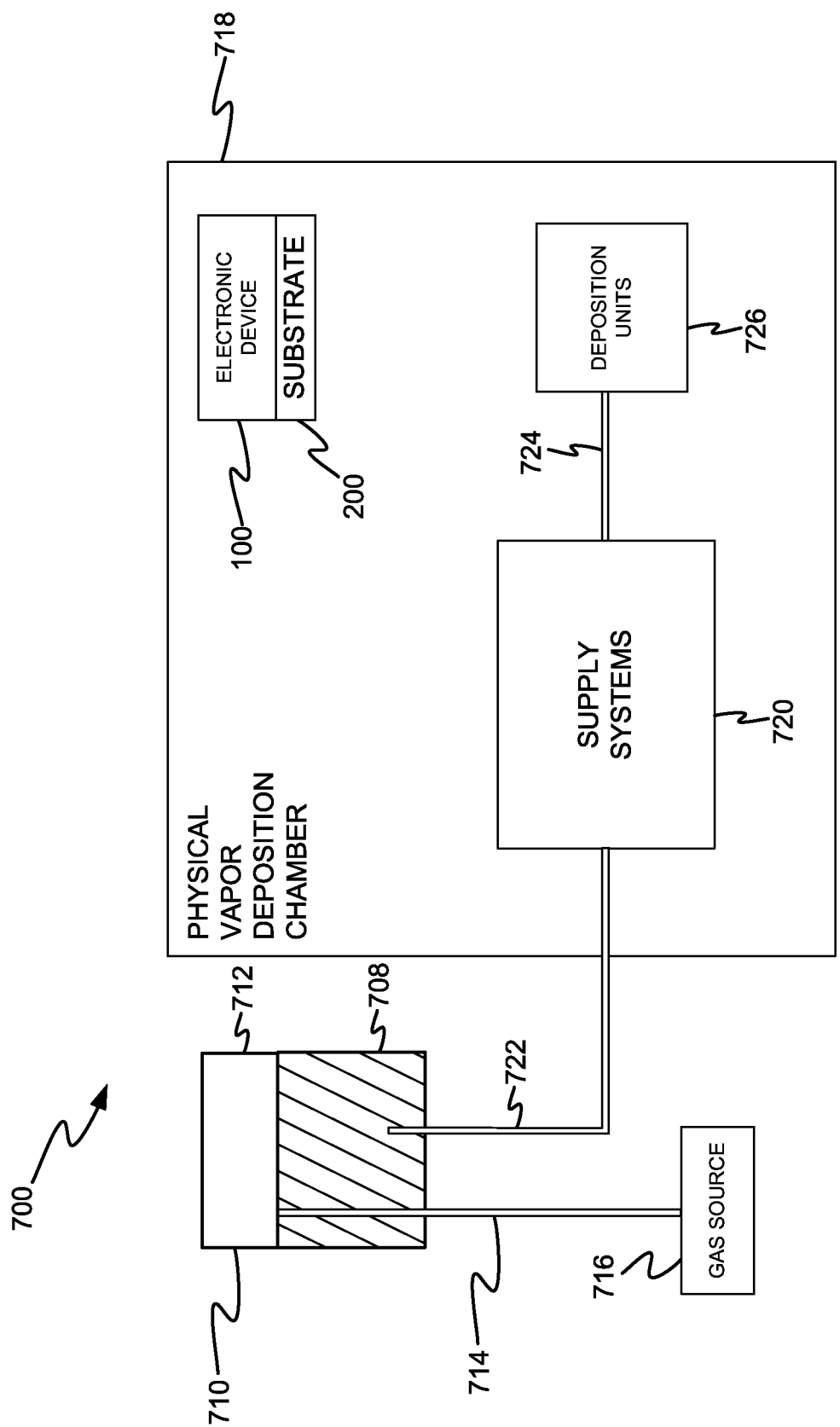
FIG. 7 illustrates a schematic view of surface processing apparatus for applying a surface treatment to a substrate in accordance with an embodiment.

In accordance with various embodiments, as illustrated in FIG. 7, a surface processing apparatus 700 may apply a surface treatment to the substrate 200 of electronic device 100. In this particular example, deposition system 700 includes one or more reservoirs 710 with various coating materials 708 (e.g., alumina, oleophobic material, $SiO_2$, $MgF_2$, $Si_3N_4$, $Al_2O_3$, HFXO, DLC, NBXO, any other anti-reflective material and/or other surface treatment). An inert gas 712 (e.g., argon or nitrogen) may be supplied by gas source 716 through purge or pressurization flow pipe 714, in order to reduce oxidation, wetting and contamination within reservoirs 710. Depending on design, reservoirs 710 are coupled to vacuum chamber 718 by one or more delivery tubes 722, as configured to deliver materials 708 from reservoirs 710 to supply systems 720. Supply systems 720 utilize a suitable combination of tubes, pumps, valves and other components to direct materials 708 into vaporizing or deposition units 726 for deposition onto substrate 200, for example, on outer surface 108 of a window 110 or bezel 104 on electronic device 100, as described above with respect to FIG. 1*a*. In the particular configuration of FIG. 7, deposition units 726 are provided in the form CVD or PVD components. Alternatively, other processes and components may be utilized, for example, to treat substrate 200 by sputtering, electron beam deposition or electron beam evaporation, IBAD, PECVD or a combination of such processes.

In some embodiments, surface treatment system 700 also controls pressure, temperature and humidity to operate chamber 718 as a vacuum chamber or other chemical or physical vapor deposition environment. Surface treatment system 700 may also maintain a particular temperature for the surface coating process, for example, between about 100 C and about 150 C, or between about 100 C and about 170 C. Air may also be provided within chamber 718, either during or after the coating process, in order to expose substrate 200 to atmosphere in a controlled process, before removal from chamber 718.

In general, supply systems 720 and deposition units 726 are controlled to deposit selected amounts of material (e.g., SiON, alumina, silica, silica glass, oleophobic materials, anti-reflective materials and other surface treatments) onto substrate 200 in particular orders and combinations, as described above with respect to FIGS. 2-6*b*. Alternatively, materials 708 such as alumina silica, and silica glass, may also be provided within one or more supply systems 720 or deposition units 726, within reservoir 710 and other external components.

Figure 8:
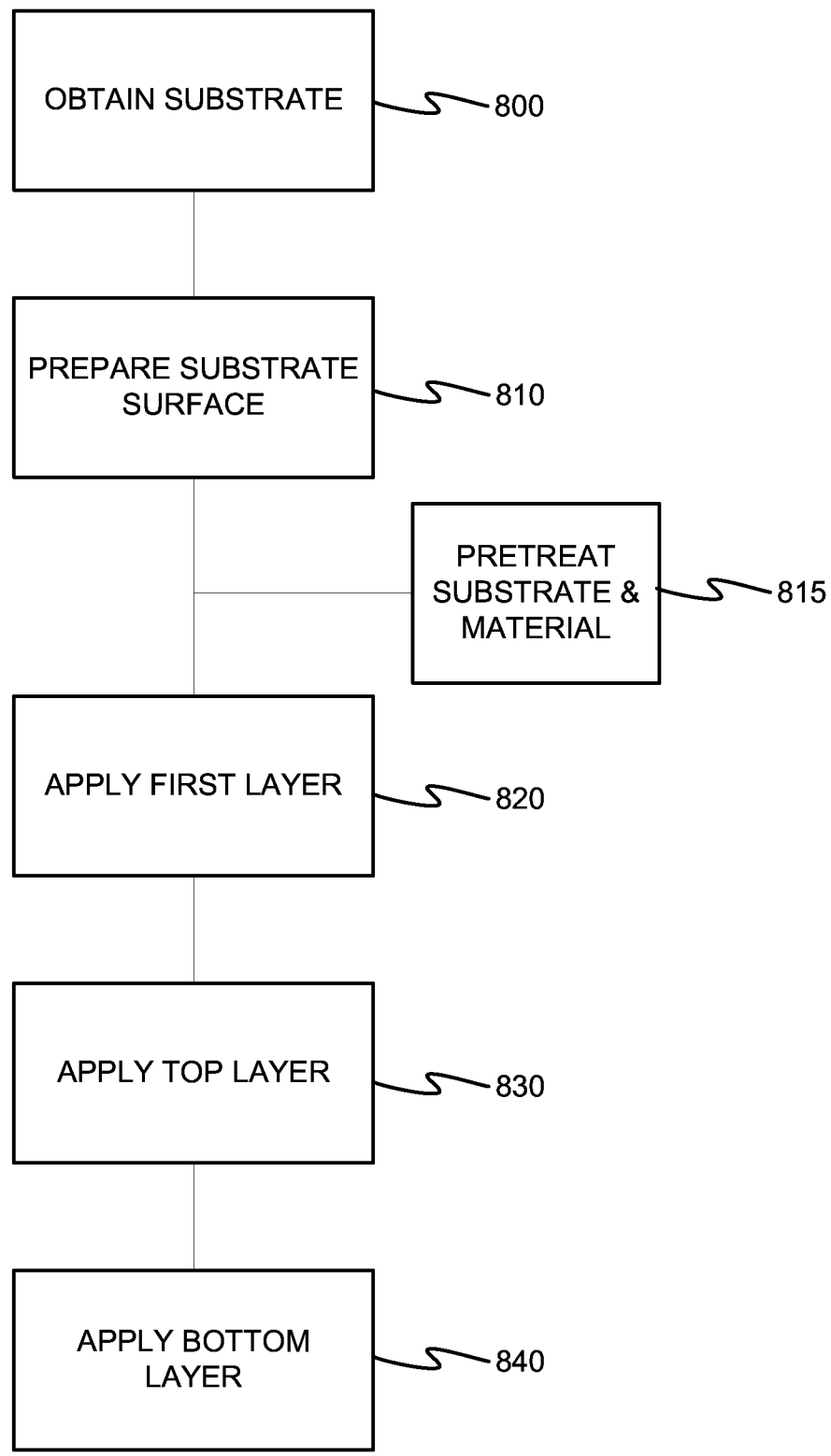
FIG. 8 is a flowchart illustrating a method of strengthening a substrate in accordance with an embodiment.

In accordance with various embodiments, as illustrated in FIG. 8, a method of applying beneficial layers to the substrate 200 may begin by obtaining a suitable substrate 200 (step 800). For example, the substrate may be a flat transparent sheet of sapphire cut to a suitable size to act as a window for the portable device 100 as described above with respect to FIGS. 1*a*-7.

The various surfaces of substrate 200 may be pre-conditioned for better adhesion and/or physical strengthening (step 810). For example, the surface of substrate 200 may be preconditioned for adhesion to the various layers. In various examples, preconditioning may include thorough processing and polishing of the sapphire surface to remove defects. In various examples, ion implantation techniques may also be utilized to improve the performance of substrate 200. Ion implantation may include orienting a first surface of the sapphire substrate relative to an ion implantation device and directing ions at the first surface of the sapphire substrate to embed them under the first surface. The process may also include one or more of heating the sapphire substrate to diffuse the implanted ions into deeper layers of sapphire substrate, cooling the sapphire substrate, and performing at least a second implantation step directing ions at the first surface of the sapphire substrate to embed the ions under the first surface.

In an ion implantation process, the surface of substrate 200 is bombarded with ions, for example, N+ (nitrogen) ions, providing a compressive stress layer of up to about 600 nm or more in thickness, for improved resistance to defect propagation. The ion implantation may amorphize the surface of the substrate allowing an amorphous layer to adhere better to the surface of the substrate. Such a treatment may be provided, for example, to the substrate 200, to the first layer 210, to the lower layer 300, to the additional layer 400, to any other layers not otherwise discussed herein and/or to any combination thereof.

The material being deposited to form the first layer 210 (e.g. alumina and/or SiON) and the sapphire substrate may be pretreated prior to depositing the material (Step 815). For example, the pretreatment may comprise heating the material and the sapphire substrate (e.g. to a temperature of 300-500° C.). After depositing the material forming the first layer, the sapphire substrate and the first layer may cool together. The differences in thermal expansion of the sapphire substrate compared to the SiON/alumina in the first layer may cause the sapphire substrate to compress the first layer, resulting in a SiON/alumina layer with significant compressive stresses.

The first layer 210 may be applied to the upper surface 206 of substrate 200 (step 820). The first layer 210 may be a material having at least one different characteristic as compared to its adjacent material (e.g. sapphire and/or additional layer 400) wherein the characteristic is selected from the list of density, strength, hardness, optical properties (e.g. refractive index), and/or oleophobic properties. The first layer 210 may be deposited on substrate 200 utilizing at least one of the processes selected from the list of CVD, PVD, IBAD, PECVD, sputtering, electron beam deposition, and/or electron beam evaporation. For example, first layer 210 may be an alumina or SiON layer which is softer than the sapphire substrate.

The additional layer 400 may be applied to first layer 210 (step 830). Additional layer 400 may be a material having at least one different characteristic than its adjacent layer (e.g. first layer 210) wherein the characteristic is selected from the list of density, strength, hardness, optical properties (e.g. refractive index), and/or oleophobic properties. For example, the additional layer 400 may be a second alumina or SiON layer with different physical characteristics than the characteristics of the material utilized in first layer 210. As described in the example of step 820, the first layer 210 may be a first alumina or SiON layer. Additional layer 400 may be a second alumina or SiON layer. The second alumina or SiON layer may have at least one different characteristic than the first layer; for example, the second layer may be harder than the first layer.

The second layer 300 may be applied to the lower surface 208 of substrate 200 (step 840). The second layer 300 may be a material having at least one different characteristic than its adjacent material (e.g. sapphire 200) wherein the characteristic is selected from the list of density, strength, hardness, optical properties (one example of which is a refractive index), and/or oleophobic properties. For example, second layer 300 may be an alumina or SiON layer. The second layer 300 may be deposited on substrate 200 utilizing at least one of the processes selected from the list of CVD, PVD, IBAD, PECVD, sputtering, electron beam deposition, and or electron beam evaporation.

Some embodiments may employ a film or coating to reduce differences in the reflectance of two adjacent materials. Generally, the appearance of a transparent material is determined by two components: specular reflection and diffuse reflection. Specular reflection is typically considered the reflection off the outer surface of the material. Specular reflection is generally a function of the refractive index of the material. Diffuse reflection is caused by a reflection of light off a backing or base material beneath a transparent material. As one example, sapphire may serve as a transparent material while an ink applied to a bottom surface of the sapphire material may serve as a backing.

When the refractive index of two materials are different, the specular reflection of the higher refractive index material will be larger, meaning that the observed appearance will have a larger proportion of specular reflectance. By contrast, a diffuse reflection is primarily determined by the surface condition and color of the backing material. Sapphire is particularly reflective, due to its high refractive index. This makes sapphire a difficult material to match with other device components.

In accordance with various embodiments, the specular and/or diffuse reflection of sapphire, as compared to a specular and/or diffuse reflection of a second material such as glass or plastic, may be reduced by applying a surface or coating to a device, or at least to a sapphire element of the device.

For example, consider a device having a surface formed of a sapphire substrate and an adjacent, but different, material. A first coating may be applied to an upper surface of the sapphire substrate. In various examples, the first coating may be a layer of alumina and/or SiON. Applying a layer of alumina and/or SiON as discussed above may function as an anti-reflective coating. The alumina and/or SiON layer may modify the specular and/or diffuse reflection of the sapphire substrate to a level consistent with the adjacent material, which may form any part of the device. Thus, even though only the sapphire is coated, the specular and/or diffuse reflection of the sapphire may match or be made closer to that of an adjacent material of a device.

The adjacent parts may be part of a second substrate, or may form part of the same substrate insofar as they may be adhered, molded, bonded or otherwise affixed to the sapphire substrate. In various embodiments the second substrate might be a material different from the sapphire substrate. As such, a layer with a lower specular reflection than sapphire, like alumina, may better match the second substrate and may also be beneficial as it is a relatively hard material, as discussed above. However, other coatings may also be used.

In some embodiments, a coating or film as described above may be placed not only on sapphire, but also on an adjacent, but different, material. For example, consider a mobile device having a back made of sapphire in one region and plastic in another. The specular and diffuse reflections of the sapphire and plastic areas are different, leading to differing optical effects on the back of the same device.

A uniform coating may be applied to both the sapphire and plastic portions of the mobile device. The coating or film may be chosen to ensure both parts, once the film is applied, have a relatively uniform specular and/or diffuse reflection, thereby optically matching this aspect of the materials to one another. It should be appreciated that the coating or film may reduce the reflective properties of one material (such as sapphire) to make it match the other material or may increase the reflective properties of a material (such as the aforementioned plastic) to match the other material (e.g., sapphire). In some embodiments, the film or coating may be alumina or SiON, which generally may increase the specular reflectance of a glass or plastic part to which it is applied to approximately match a sapphire element, whether the sapphire is coated or uncoated by the alumina or SiON. Further, such a coating may be scratch resistant and provide additional properties to the coated material, as generally described herein.

A general discussion of reflectance matching follows. In accordance with various embodiments, a sapphire substrate may be applied to a device (an example of such a substrate is Illustrated in FIGS. 1a-2). The sapphire substrate may include a first surface and a second surface (e.g. FIG. 2 upper surface 206 and lower surface 208) with a first backing material applied to the second surface. For example, FIG. 3 illustrates a second layer 300 on lower surface 208. This layer could potentially be any material; for example layer 300 may be a first backing material. In some embodiments, the first backing material may be an ink colorant. A first layer may be applied to the first surface. The first layer may be an anti-reflective coating. The first layer may be alumina or SiON, for example.

A second substrate may also be applied to the device. The second substrate may be any part of the device such as a button, bezel, cover, or similar part (see, e.g., FIG. 1a). The second substrate may be formed from any material. For example, the material may be glass, plastic, aluminum, carbon fiber, or any other material that may be used on a device.

A color matching material may be applied to the second substrate. A colorant may be applied to a lower surface of the second substrate, similar to the lower layer 300 illustrated in FIG. 3. The colorant may be a color matching material that is selected to match the appearance of the first backing material discussed above. Applying an anti-reflective layer like alumina to the second substrate may suitably match the visual aspects of the second substrate with the color matching material and the first substrate with its ink colorant. An additional layer may be added to the second substrate as well. For example, alumina may be applied to the upper surface of the second substrate. This may further match the specular reflection of the first substrate and the second substrate. The may also provide a harder surface to the second substrate.

In various embodiments, the second substrate may have a colorant applied to its upper surface. For example, the second substrate may be plastic. In some embodiments, a plastic substrate may be colored on all surfaces (as it may not be transparent). In such an embodiment the alumina coating may be applied over the colorant. This may make the plastic part more wear resistant as well as matching the specular reflection of the plastic part to, or nearly to, the sapphire part.

Although the foregoing discussion has presented specific embodiments, the foregoing merely illustrates the principles of the invention. Persons skilled in the art will recognize that changes may be made in form and detail without departing from the spirit and scope of the disclosure as various modifications and alterations to the described embodiments will be apparent to those skilled in the art, in view of the teachings herein. For example, the processing steps may be performed in another order, or in different combinations. It will thus be appreciated that those having skill in the art will be able to devise numerous systems, arrangements and methods which, although not explicitly shown or described herein, embody the principles of the disclosure and are thus within the spirit and scope of the present invention. From the above description and drawings, it will be understood by those of ordinary skill in the art that the particular embodiments shown and described are for purposes of illustration only, and references to details of particular embodiments are not intended to limit the scope of the present invention, as defined by the appended claims.

We claim:

1. An electronic device, comprising:
   a window, comprising:

a sapphire substrate comprising a first surface and a second surface each having an array of surface defects, the second surface positioned opposite the first surface;

a first layer adhered to the first surface and the array of surface defects on the first surface to fill the surface defects, the first layer formed of one of alumina or silicon oxynitride at a first thickness; and a second layer adhered to the second surface and the array of surface defects on the second surface, the second layer formed from one of alumina or silicon oxynitride at a second thickness that is less than the first thickness, wherein the second layer induces a compressive stress within the sapphire substrate.

2. The electronic device of claim 1 wherein the second layer is formed at an elevated temperature and cooled to produce the compressive stress within the sapphire substrate.

3. The electronic device of claim 1 further comprising: an additional layer adhered to the first layer, wherein the additional layer is formed from the same chemical composition as the first layer but has a different structure than the first layer, the different structure causing the additional layer to have a different physical characteristic.

4. The electronic device of claim 1, wherein the first layer has a hardness lower than the sapphire substrate, and wherein the hardness of the first layer is 7 to 9 on the Mohs scale.

5. The electronic device of claim 3, wherein the additional layer is alumina and the alumina of the additional layer has a hardness between the hardness of the sapphire and the hardness of the first layer.

6. The electronic device of claim 3, wherein the additional layer is one of silicone oxynitride or alumina and is softer than the first layer.

7. The electronic device of claim 3, wherein:

the additional layer comprises a polymer matrix having a plurality of blocks suspended within the polymer matrix; and the plurality of blocks are configured to deflect into the depth of the polymer matrix when a force is exerted thereon.

8. The electronic device of claim 3, wherein the additional layer is an anti-reflective coating having a refractive index less than the first layer.

9. The electronic device of claim 1, wherein:

one of at least the first surface or second surface is an amorphous surface; and the amorphous surface is ion-implanted.

10. An electronic device, comprising:

a housing; and a sapphire structure coupled to the housing, comprising:

a sapphire layer having an array of surface defects; and first and second layers directly bonded to opposing surfaces of the sapphire structure to fill the surface defects and having distinct thicknesses, wherein:

at least one of the first and second layers induces a compressive stress within the sapphire structure.

11. The electronic device of claim 10, wherein the first and second layers are formed from one of alumina or silicon oxynitride.

12. The electronic device of claim 10, wherein the sapphire structure has a refractive index that is distinct from a refractive index of the first and second layers.

13. The electronic device of claim 10, where the sapphire structure forms an exterior surface of the electronic device.

14. The electronic device of claim 10, wherein:

the second layer induces the compressive stress; and the second layer has a thickness that is less than a thickness of the first layer.

15. The electronic device of claim 10, wherein the first layer has a hardness that is distinct from a hardness of the second layer.

16. An electronic device, comprising:

a first sheet defined by a sapphire structure having first and second surfaces with an array of surface defects;

a first layer positioned on the first surface and over the surface defects; and a second layer positioned on the second surface and over the surface defects, wherein:

the first and second layers are formed from one of alumina or silicon oxynitride; and the second layer induces a compressive stress within the first sheet.

17. The electronic device of claim 16, wherein the second layer has a thickness that is less than a thickness of the first layer.

18. The electronic device of claim 16, further comprising:

an additional layer adhered to the first layer and forming an anti-reflective coating having a refractive index that is less than the first layer.

19. The electronic device of claim 18, wherein a difference between a refractive index of the additional layer and a refractive index of the first sheet is greater than:

a difference between a refractive index of the first layer and the refractive index of the first sheet; and a difference between the refractive index of the first layer and the refractive index of the additional layer.

* * * * *